(12) United States Patent
Lee et al.

(10) Patent No.: US 8,203,213 B2
(45) Date of Patent: Jun. 19, 2012

(54) METHODS FOR PACKAGING MICROELECTRONIC DEVICES AND MICROELECTRONIC DEVICES FORMED USING SUCH METHODS

(75) Inventors: Choon Kuan Lee, Singapore (SG); Chin Hui Chong, Singapore (SG); David J. Corisis, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/826,384

(22) Filed: Jun. 29, 2010

(65) Prior Publication Data

US 2010/0276814 A1 Nov. 4, 2010

Related U.S. Application Data

(62) Division of application No. 11/412,633, filed on Apr. 26, 2006, now Pat. No. 7,759,221.

(30) Foreign Application Priority Data

Dec. 29, 2005 (SG) ............................. 200508555-0

(51) Int. Cl.
    *H01L 23/48* (2006.01)
(52) U.S. Cl. ............... 257/776; 257/773; 257/E23.143; 257/E23.151; 257/E23.175
(58) Field of Classification Search ............... 257/773, 257/776, E23.145, E23.151, E23.175; 438/455, 438/668, 725, 690, 700
See application file for complete search history.

(56) References Cited

U.S. PATENT DOCUMENTS

| | | | |
|---|---|---|---|
| 5,128,831 | A | 7/1992 | Fox, III et al. |
| 5,252,857 | A | 10/1993 | Kane et al. |
| 5,518,957 | A | 5/1996 | Kim |
| 5,593,927 | A | 1/1997 | Farnworth et al. |
| 5,677,566 | A | 10/1997 | King et al. |
| 5,696,033 | A | 12/1997 | Kinsman |
| 5,739,585 | A | 4/1998 | Akram et al. |
| D394,844 | S | 6/1998 | Farnworth et al. |

(Continued)

FOREIGN PATENT DOCUMENTS

EP 1408547 A2 4/2004

(Continued)

OTHER PUBLICATIONS

Search Report and Examination Report for Singapore Application No. 200508555-0, 8 pages, May 3, 2007.

*Primary Examiner* — Julio J Maldonado
(74) *Attorney, Agent, or Firm* — Perkins Coie LLP (57) ABSTRACT

Methods for packaging microelectronic devices and microelectronic devices formed using such methods are disclosed herein. One aspect of the invention is directed toward a method for packaging a microelectronic device that includes coupling an active side of a microelectronic die to a surface of a support member. The microelectronic die can have a backside opposite the active side, a peripheral side extending at least part way between the active side and the backside, and at least one through-wafer interconnect. The method can further include applying an encapsulant to cover a portion of the surface of the support member so that a portion of the encapsulant is laterally adjacent to the peripheral side, removing material from a backside of the microelectronic die to expose a portion of at least one through-wafer interconnect, and applying a redistribution structure to the backside of the microelectronic die.

21 Claims, 7 Drawing Sheets

U.S. PATENT DOCUMENTS

| | | | |
|---|---|---|---|
| D402,638 S | 12/1998 | Farnworth et al. | |
| 5,851,845 A | 12/1998 | Wood et al. | |
| 5,883,426 A | 3/1999 | Tokuno et al. | |
| 5,891,753 A | 4/1999 | Akram | |
| 5,891,797 A | 4/1999 | Farrar | |
| 5,893,726 A | 4/1999 | Farnworth et al. | |
| 5,898,224 A | 4/1999 | Akram | |
| 5,925,930 A | 7/1999 | Farnworth et al. | |
| 5,933,713 A | 8/1999 | Farnworth | |
| 5,938,956 A | 8/1999 | Hembree et al. | |
| 5,946,553 A | 8/1999 | Wood et al. | |
| 5,958,100 A | 9/1999 | Farnworth et al. | |
| 5,986,209 A | 11/1999 | Tandy | |
| 5,989,941 A | 11/1999 | Wensel | |
| 5,990,566 A | 11/1999 | Farnworth et al. | |
| 5,994,784 A | 11/1999 | Ahmad | |
| RE36,469 E | 12/1999 | Wood et al. | |
| 6,008,070 A | 12/1999 | Farnworth | |
| 6,008,074 A | 12/1999 | Brand | |
| 6,018,249 A | 1/2000 | Akram et al. | |
| 6,020,624 A | 2/2000 | Wood et al. | |
| 6,020,629 A | 2/2000 | Farnworth et al. | |
| 6,025,728 A | 2/2000 | Hembree et al. | |
| 6,028,365 A | 2/2000 | Akram et al. | |
| 6,043,109 A | 3/2000 | Yang et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,051,878 A | 4/2000 | Akram et al. | |
| 6,072,233 A | 6/2000 | Corisis et al. | |
| 6,072,236 A | 6/2000 | Akram et al. | |
| 6,075,288 A | 6/2000 | Akram | |
| 6,081,429 A | 6/2000 | Barrett | |
| 6,089,920 A | 7/2000 | Farnworth et al. | |
| 6,097,087 A | 8/2000 | Farnworth et al. | |
| 6,103,547 A | 8/2000 | Corisis et al. | |
| 6,107,122 A | 8/2000 | Wood et al. | |
| 6,107,680 A | 8/2000 | Hodges | |
| 6,117,382 A | 9/2000 | Thummel | |
| 6,124,634 A | 9/2000 | Akram et al. | |
| 6,130,474 A | 10/2000 | Corisis | |
| 6,148,509 A | 11/2000 | Schoenfeld et al. | |
| 6,150,717 A | 11/2000 | Wood et al. | |
| 6,159,764 A | 12/2000 | Kinsman et al. | |
| 6,172,419 B1 | 1/2001 | Kinsman | |
| 6,175,149 B1 | 1/2001 | Akram | |
| 6,184,465 B1 | 2/2001 | Corisis | |
| 6,188,232 B1 | 2/2001 | Akram et al. | |
| 6,198,172 B1 | 3/2001 | King et al. | |
| 6,201,304 B1 | 3/2001 | Moden | |
| 6,208,519 B1 | 3/2001 | Jiang et al. | |
| 6,210,992 B1 | 4/2001 | Tandy et al. | |
| 6,212,767 B1 | 4/2001 | Tandy | |
| 6,214,716 B1 | 4/2001 | Akram | |
| 6,215,175 B1 | 4/2001 | Kinsman | |
| 6,225,689 B1 | 5/2001 | Moden et al. | |
| 6,228,548 B1 | 5/2001 | King et al. | |
| 6,229,202 B1 | 5/2001 | Corisis | |
| 6,232,666 B1 | 5/2001 | Corisis et al. | |
| 6,235,554 B1 | 5/2001 | Akram et al. | |
| 6,239,489 B1 | 5/2001 | Jiang | |
| 6,246,108 B1 | 6/2001 | Corisis et al. | |
| 6,247,629 B1 | 6/2001 | Jacobson et al. | |
| 6,252,308 B1 | 6/2001 | Akram et al. | |
| 6,258,623 B1 | 7/2001 | Moden et al. | |
| 6,258,624 B1 | 7/2001 | Corisis | |
| 6,259,153 B1 | 7/2001 | Corisis | |
| 6,265,766 B1 | 7/2001 | Moden | |
| 6,277,671 B1 | 8/2001 | Tripard | |
| 6,281,042 B1 | 8/2001 | Ahn et al. | |
| 6,281,577 B1 | 8/2001 | Oppermann et al. | |
| 6,284,571 B1 | 9/2001 | Corisis et al. | |
| 6,285,204 B1 | 9/2001 | Farnworth | |
| 6,291,894 B1 | 9/2001 | Farnworth et al. | |
| 6,294,839 B1 | 9/2001 | Mess et al. | |
| 6,297,547 B1 | 10/2001 | Akram | |
| 6,303,981 B1 | 10/2001 | Moden | |
| 6,303,985 B1 | 10/2001 | Larson et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,329,222 B1 | 12/2001 | Corisis et al. | |
| 6,331,221 B1 | 12/2001 | Cobbley | |
| 6,331,453 B1 | 12/2001 | Bolken et al. | |
| 6,332,766 B1 | 12/2001 | Thummel | |
| 6,365,434 B1 | 4/2002 | Rumsey et al. | |
| 6,429,528 B1 | 8/2002 | King et al. | |
| 6,437,586 B1 | 8/2002 | Robinson | |
| 6,451,709 B1 | 9/2002 | Hembree | |
| 6,483,044 B1 | 11/2002 | Ahmad | |
| 6,548,376 B2 | 4/2003 | Jiang | |
| 6,548,757 B1 | 4/2003 | Russell et al. | |
| 6,552,910 B1 | 4/2003 | Moon et al. | |
| 6,558,600 B1 | 5/2003 | Williams et al. | |
| 6,560,117 B2 | 5/2003 | Moon | |
| 6,561,479 B1 | 5/2003 | Eldridge | |
| 6,564,979 B2 | 5/2003 | Savaria | |
| 6,576,494 B1 | 6/2003 | Farnworth | |
| 6,576,495 B1 | 6/2003 | Jiang et al. | |
| 6,589,820 B1 | 7/2003 | Bolken | |
| 6,607,937 B1 | 8/2003 | Corisis | |
| 6,614,092 B2 | 9/2003 | Eldridge et al. | |
| 6,622,380 B1 | 9/2003 | Grigg | |
| 6,638,595 B2 | 10/2003 | Rumsey et al. | |
| 6,644,949 B2 | 11/2003 | Rumsey et al. | |
| 6,653,173 B2 | 11/2003 | Bolken | |
| 6,670,719 B2 | 12/2003 | Eldridge et al. | |
| 6,672,325 B2 | 1/2004 | Eldridge | |
| 6,673,649 B1 | 1/2004 | Hiatt et al. | |
| 7,074,703 B2 * | 7/2006 | Fukazawa | 438/598 |
| 7,247,518 B2 * | 7/2007 | Shibata | 438/108 |
| 7,279,361 B2 | 10/2007 | Karnezos | |
| 7,354,798 B2 | 4/2008 | Pogge et al. | |
| 7,361,532 B2 * | 4/2008 | Fukazawa | 438/113 |
| 2004/0119166 A1 * | 6/2004 | Sunohara | 257/758 |
| 2004/0178495 A1 * | 9/2004 | Yean et al. | 257/723 |
| 2005/0212126 A1 | 9/2005 | Sunohara | |
| 2007/0155048 A1 | 7/2007 | Lee et al. | |

FOREIGN PATENT DOCUMENTS

| | | | |
|---|---|---|---|
| WO | 0217392 | A2 | 2/2002 |

* cited by examiner

METHODS FOR PACKAGING MICROELECTRONIC DEVICES AND MICROELECTRONIC DEVICES FORMED USING SUCH METHODS

CROSS-REFERENCE TO RELATED APPLICATIONS

This application is a divisional of U.S. application Ser. No. 11/412,633 filed Apr. 26, 2006, which claims foreign priority benefits of Singapore Application No. 200508555-0 filed Dec. 29, 2005, both of which are incorporated herein by reference in their entirety.

TECHNICAL FIELD

The present invention is related to methods for packaging microelectronic devices and microelectronic devices formed using such methods.

BACKGROUND

Packaged microelectronic devices are used in cellular phones, pagers, personal digital assistants, computers, and many other electronic products. Conventional packaged microelectronic devices can include a singulated microelectronic die, an interposer substrate or lead frame attached to the die, and a molded casing around the die. The die generally includes an integrated circuit and an active side with a plurality of bond-pads coupled to the integrated circuit. The bond-pads are typically coupled to terminals on the interposer substrate or lead frame, and supply voltage, signals, etc., are transmitted to and from the integrated circuit via the bond-pads. In addition to the terminals, the interposer substrate can also include ball-pads coupled to the terminals by conductive traces supported in a dielectric material. Solder balls can be attached to the ball-pads in one-to-one correspondence to define a "ball-grid array." Packaged microelectronic devices with ball-grid arrays are generally higher grade packages having lower profiles and higher pin counts than conventional packages using lead frames.

One such conventional packaged microelectronic device is a build up package ("BUP") microelectronic device. BUP devices are formed by placing multiple singulated microelectronic dies active side down on a temporary carrier. A fill material is used to cover the dies and the carrier. Once the fill material sets up, the temporary carrier is removed. The active sides of the dies are cleaned and then a redistribution layer is applied to the active sides of the dies. Often solder balls are connected to the redistribution layer and a dielectric layer is placed over portions of the redistribution layer so that the solder balls extend through the dielectric layer. The fill material between the dies is then cut to separate the dies from one another and form multiple BUP devices. The solder balls and redistribution layer can then be used to connect the BUP device to a printed circuit board. In certain cases, the redistribution layer can extend beyond the edge of the die onto the fill material to increase the area available for the array of solder balls.

BUP microelectronic devices can also be formed by placing multiple singulated dies active side up on a temporary carrier and placing a fill material between the dies. Once the fill material hardens, the temporary carrier is removed and the BUP devices are separated by cutting the fill material between the dies. However, with this process it can be difficult to place a redistribution layer on the active sides because the active sides and the fill material between the dies may not form a sufficiently planar surface for effective and efficient application of a redistribution layer.

The foregoing processes have a large number of steps, and thus fabricating BUP devices can be time consuming and expensive. Additionally, BUP devices may not be well suited for use in stacked die arrangements because BUP devices generally only have contacts on the active side of each device. Accordingly, a significant amount of space on a circuit board must be reserved for BUP devices in products that require several such devices. This can be problematic because the sizes of electronic products that use BUP devices are decreasing in response to consumer demand. Therefore, it would be desirable to produce BUP devices that are well suited for stacked die arrangements.

DETAILED DESCRIPTION

A. Overview/Summary

The following disclosure describes methods for packaging microelectronic devices and microelectronic devices formed using such methods. One aspect of the invention is directed toward a method for packaging microelectronic devices that includes coupling multiple microelectronic dies to a surface of a support member. Individual microelectronic dies can have an active side, a backside, and a through-wafer interconnect extending from the active side toward the backside. The individual dies generally have a plurality of through-wafer interconnects having a first end at the active side and a second end at the backside or at an intermediate level within the die toward the backside. The active side of each microelectronic die can be coupled to the surface of the support member. The method can further include applying an encapsulant to cover at least a portion of the surface of the support member so that a portion of the encapsulant is laterally adjacent to the microelectronic dies. The method can still further include removing material from the backside of the microelectronic dies to expose a portion of the through-wafer interconnects, and applying a redistribution structure to the backside of the microelectronic dies. The redistribution structure can be electrically coupled to the through-wafer interconnects.

Other aspects of the invention are directed toward a method for packaging a microelectronic device that includes coupling an active side of a microelectronic die to a surface of a support member. The microelectronic die can have a backside opposite the active side, a peripheral side extending at least part way between the active side and the backside, and at least one through-wafer interconnect. The method can further include applying an encapsulant to cover at least a portion of the surface of the support member so that a portion of the encapsulant is laterally adjacent to the peripheral side. The method can still further include removing material from a backside of the microelectronic die to expose a portion of at least one through-wafer interconnect, and applying a redistribution structure to the backside of the microelectronic die. The redistribution structure can be electrically coupled to the at least one through-wafer interconnect.

Still other aspects of the invention are directed toward a method for packaging microelectronic devices that includes attaching multiple microelectronic dies to a surface of a support member. Individual microelectronic dies can have an active side, a backside, and at least one through-wafer interconnect. The active side of each microelectronic die can be attached to the surface of the support member. The method can further include applying an encapsulant to cover the multiple microelectronic dies and at least a portion of the surface of the support member so that a portion of the encapsulant is laterally adjacent to the microelectronic dies. The method can still further include removing material from the backside of the microelectronic dies to expose a portion of the through-wafer interconnects and applying a redistribution structure to the backside of the microelectronic dies. The redistribution structure can be electrically coupled to the through-wafer interconnects. The method can yet further include connecting at least one of solder balls and solder bumps to the at least one redistribution structure and singulating the microelectronic dies.

Yet other aspects of the invention are directed toward a method for packaging a microelectronic device that includes coupling an active side of a microelectronic die to a surface of a support member and applying an encapsulant to cover at least a portion of the microelectronic die and at least a portion of the surface of the support member so that a portion of the encapsulant is laterally adjacent to the microelectronic die. The method can further include removing material from a backside of the microelectronic die to expose a portion of at least one through-wafer interconnect and applying a redistribution structure to the backside of the microelectronic die. The redistribution structure can be electrically coupled to the at least one through-wafer interconnect. The method can still further include connecting at least one of solder balls and solder bumps to the redistribution structure.

Still other aspects of the invention are directed toward a microelectronic device that includes a microelectronic die having an active side, a backside opposite the active side, a peripheral side extending at least part way between the active side and the backside, and at least one through-wafer interconnect. The through-wafer interconnect can have an active side portion electrically coupled to the active side of the microelectronic die and a backside portion. The device can further include a redistribution structure electrically coupled to the backside portion of the at least one through-wafer interconnect and an encapsulant laterally adjacent to the peripheral side of the microelectronic die.

Yet other aspects of the invention are directed toward microelectronic devices that include a support member having a surface and multiple microelectronic dies. Each microelectronic die can have an active side, a backside, and at least one through-wafer interconnect. The at least one through-wafer interconnect can have a first portion electrically coupled to the active side of the microelectronic die and a second portion. The multiple microelectronic dies can be coupled to the surface of the support member so that the active side of the microelectronic die is adjacent to the surface of the support member. The device can further include at least one redistribution structure. The at least one redistribution structure can be electrically coupled to the second portions of the through-wafer interconnects. The device can further include an encapsulant covering at least a portion of the support member so that a portion of the encapsulant is laterally adjacent to the microelectronic dies.

Still other aspects of the invention are directed toward stacked microelectronic devices that include a first microelectronic device and at least one second microelectronic device stacked with the first microelectronic device. The first microelectronic device can include a microelectronic die having an active side, a backside, at least one peripheral side, and at least one through-wafer interconnect. The through-wafer interconnect can have a first portion electrically coupled to the active side of the microelectronic die and a second portion. The first microelectronic device can further include a redistribution structure electrically coupled to the second portion of the at least one through-wafer interconnect and an encapsulant adjacent to the at least one peripheral side.

Many specific details of certain embodiments of the invention are set forth in the following description and in FIGS. 1-12 to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention. Where the context permits, singular or plural terms may also include plural or singular terms, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of features or components are not precluded.

Figure 1:
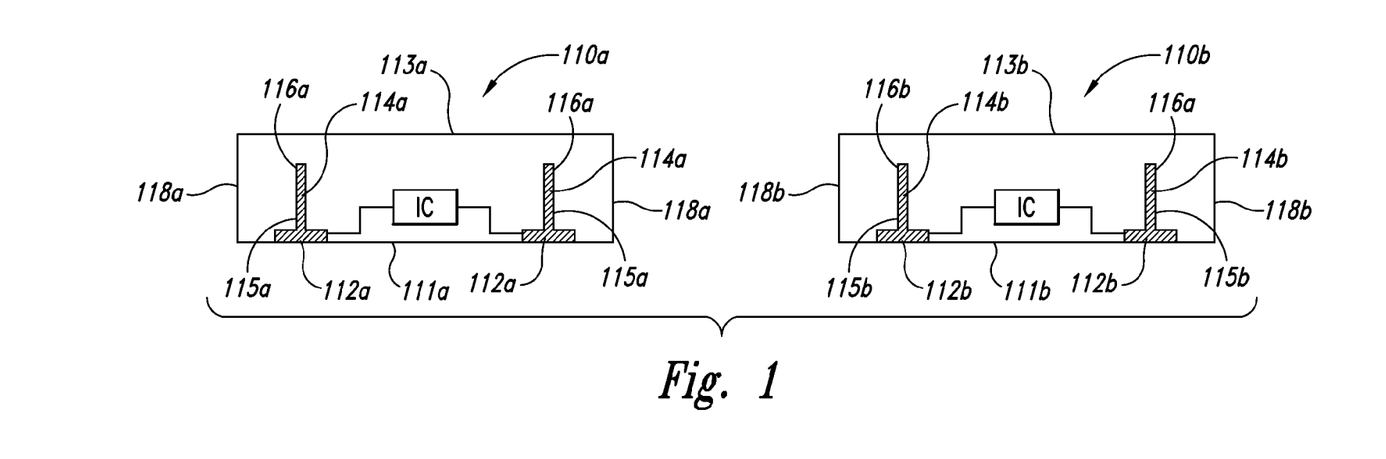
FIGS. 1-8 schematically illustrate stages in a method for packaging microelectronic devices in accordance with certain embodiments of the invention.

B. Methods for Packaging Microelectronic Devices and Microelectronic Devices Formed Using Such Methods FIGS. 1-8 illustrate various stages in a method for packaging microelectronic devices build up package microelectronic devices and microelectronic devices formed using such a method, in accordance with certain embodiments of the invention. The examples of the method shown in FIGS. 1-8 are particularly useful for fabricating build up package devices for use in single and/or stacked die arrangements. FIG. 1 is a partially schematic cross-sectional illustration of multiple microelectronic dies 110, shown as a first microelectronic die 110a and a second microelectronic die 110b. The first die 110a can include an active side 111a, a backside 113a (e.g., opposite the active side), one or more peripheral sides 118a between the active side 111a and the backside 113a, and integrated circuitry IC (shown schematically). The active side 111a can include one or more die contacts 112a (e.g., bondpads) electrically coupled to the integrated circuitry IC. The first die 110a can also include one or more through-wafer interconnects 114a that are electrically coupled to the integrated circuitry IC and that extend through at least a portion of the first die 110a. The through-wafer interconnects 114a can include first portions 115a proximate to the active side of the first die 110a and second portions 116a positioned opposite the first portions 115a. The first portions 115a of the through-wafer interconnects 114a of the first die 110a can be electrically coupled to the integrated circuitry IC (e.g., via the die contacts 112a).

Similarly, the second die 110b includes an active side 111b with one or more die contacts 112b, a backside 113b, one or more peripheral sides 118b, integrated circuitry IC (shown schematically), and one or more through-wafer interconnects 114b with first portions 115b and second portions 116b. Although in the illustrated embodiment the dies 110 have the same configuration, in other embodiments the dies 110 may have different features to perform different functions. For example, various dies 110 can include memory devices, processors, or other types of devices that include integrated circuitry (e.g., DRAM, SRAM, Flash, Imagers, PCRAM, MRAM, and CAM).

Figure 2:
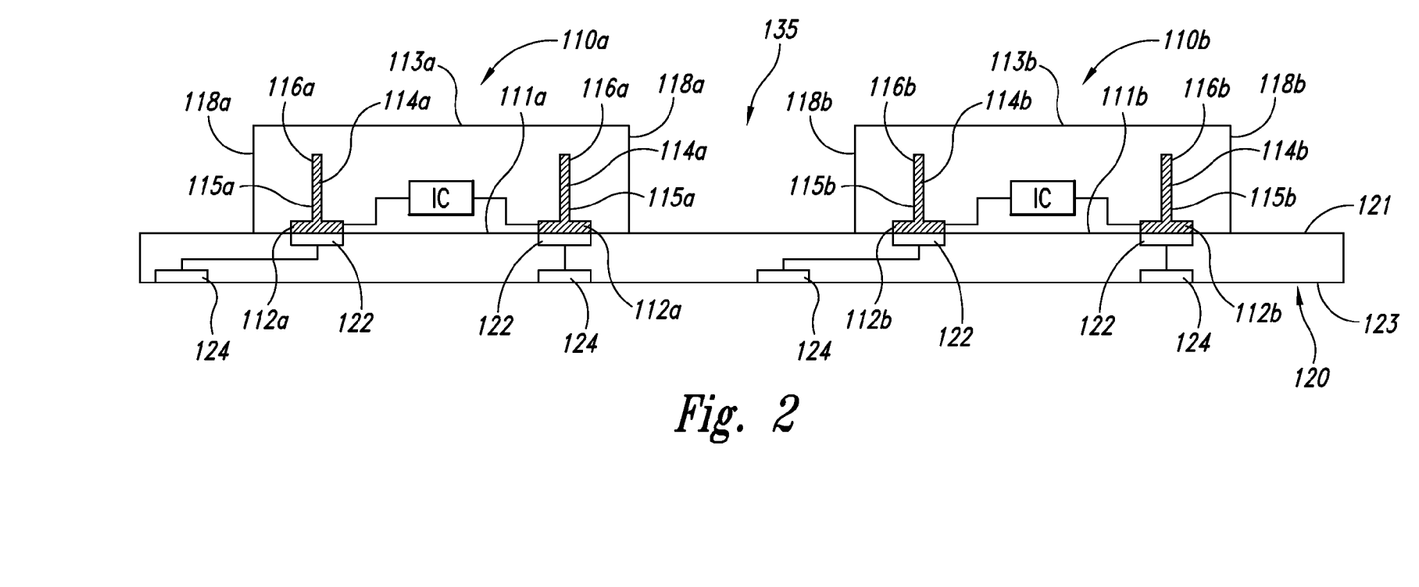

FIG. 2 is a partially schematic cross-sectional illustration of the first and second dies 110a and 110b coupled to a support member 120 that has a first side 121 and a second side 123. In certain embodiments the support member 120 can include various contacts and connectors. For example, in FIG. 2 the support member 120 includes first support contacts 122 at the first side 121 and second support contacts 124 at the second side 123 that are electrically coupled to corresponding first support contacts 122. The first and second dies 110a and 110b can be temporarily or permanently coupled (e.g., mechanically and/or electrically) to the support member 120 with their respective active sides 111a and 111b facing the first surface 121 of the support member 120.

For example, in the illustrated embodiment the active sides 111a and 111b of the first and second dies 110a and 110b are mechanically attached to the support member 120. The active sides 111a and 111b of the dies 110a and 110b can be coupled to the support member 120 using various techniques well known to those skilled in the art. For example, the dies 110 can be mechanically or physically coupled or attached to the support member 120 using various types of adhesive films, epoxy, tape, paste, or other suitable material. In certain embodiments were the dies 110 are temporarily attached to the support member 120, a releasable attachment method can be used, such as tapes or adhesives that have suitable thermal release characteristics (e.g., where the bond is released at a certain temperature).

Additionally, the die contacts 112a and 112b of the first and second dies 110a and 110b contact the first support contacts 122 to electrically couple the integrated circuitry IC of the first and second dies 110a and 110b with the support member 120. Because the first support contacts 122 are electrically coupled to the second support contacts 124 in the illustrated embodiment, the integrated circuitries IC of the first and second dies are also electrically coupled to the second support contacts 124. In selected embodiments, the dies 110 can be electrically coupled to the support 120 via various techniques. For example, in certain embodiments contacts on the dies 110 can be positioned to physically touch contacts on the support 120. In other embodiments, other techniques can be used to electrically couple the dies 110 to the support 120, for example, flip chip and direct die attach methods can also be used. In certain embodiments, the technique used to electrically couple the dies 110 to the support 120 can also mechanically couple the dies 110 to the support 120 (e.g., using various flip chip attach techniques). In other embodiments, the support has no electrical contacts and the dies 100 are only mechanically attached to the support.

Figure 3:
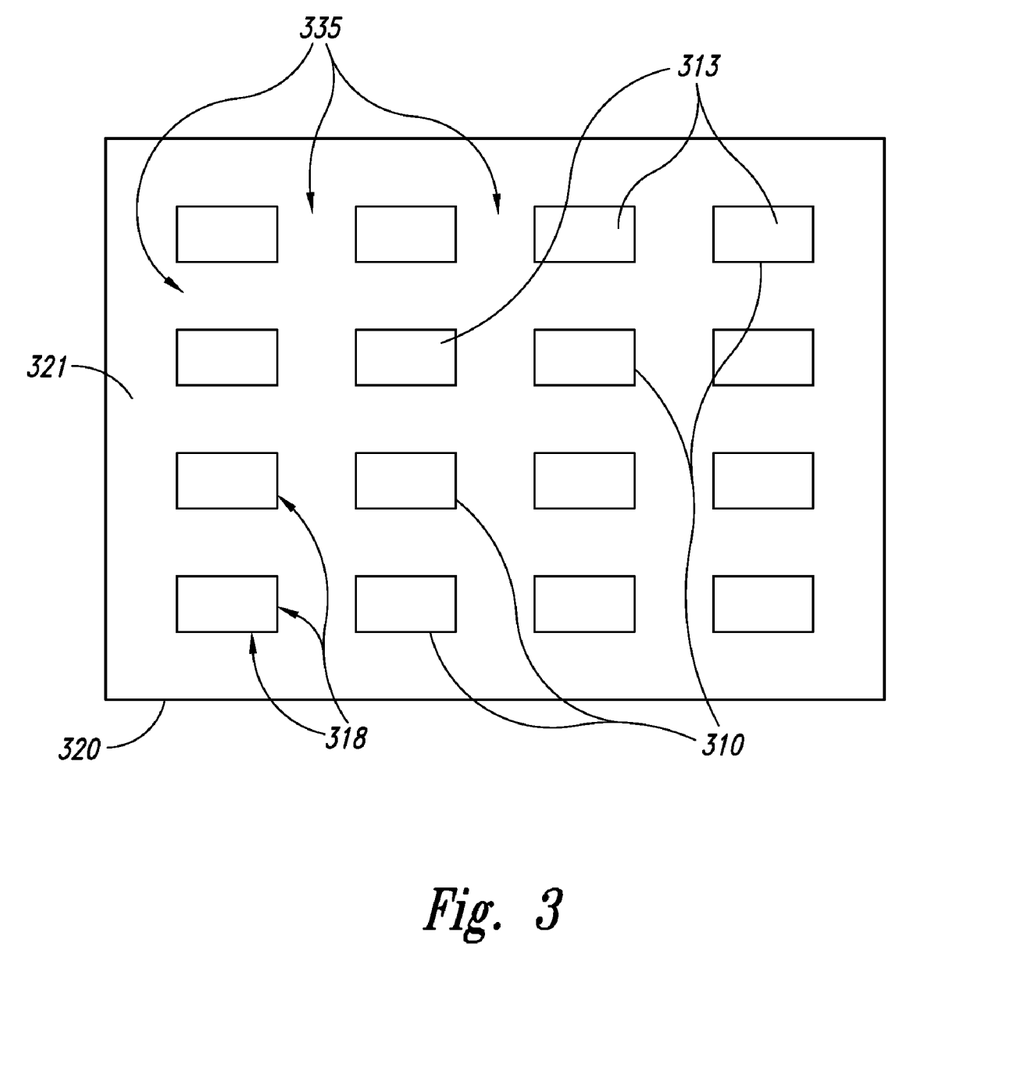

Although in the illustrated embodiment the first and second dies 110a and 110b are shown laterally disposed from each other in one direction, it is understood that multiple dies can be positioned relative to the support member in other arrangements. For example, FIG. 3 is a partially schematic top plan view of multiple dies 310 coupled to a support member 320 so that the dies are laterally disposed from one another in multiple directions (e.g., two directions) in accordance with certain embodiments of the invention. In FIG. 3 the dies 310 are coupled to the support 320 with the active sides of the dies 310 adjacent to a surface 321 of the support 320 and the backsides 313 of the dies 310 opposite the active sides. Additionally, as shown in FIG. 3, there is space 335 between and around (e.g., laterally adjacent to) the dies 310. The space 335 is positioned above the surface 321 of the support 320. Accordingly, portions of the space 335 are laterally disposed from the one or more peripheral sides 318 of the dies 310 and from the dies 310 themselves.

Figure 4:
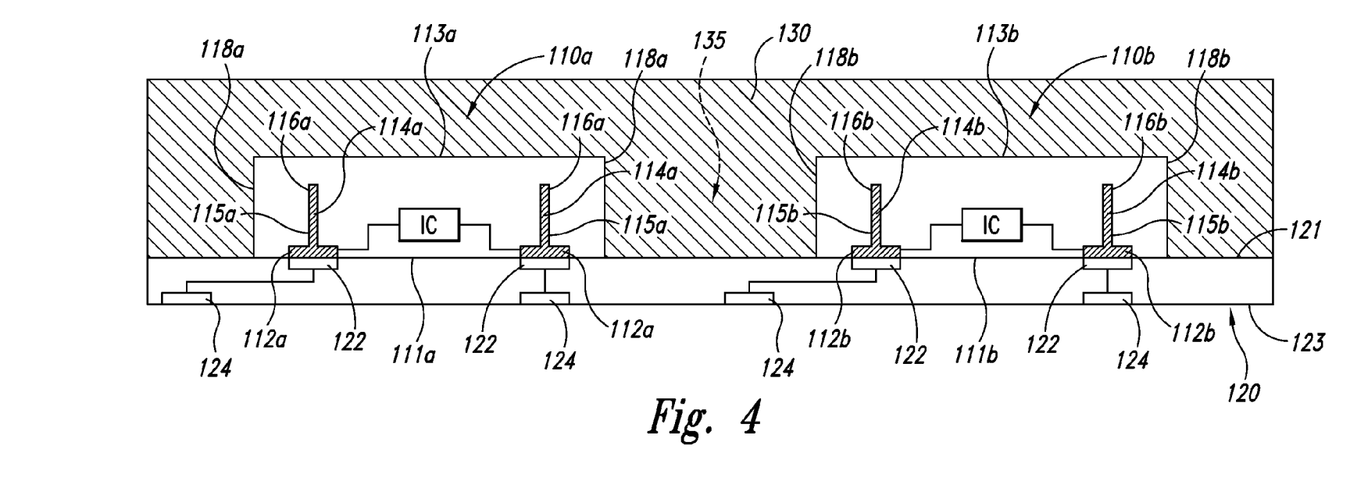

FIG. 4 is a partially schematic cross-sectional view of the dies 110 and support member 120 shown in FIG. 3 after an encapsulant 135 has been applied to cover at least a portion of the first surface 121 of the support member 120. In the illustrated embodiment, the encapsulant has been applied to the extent that it covers the backsides 113a and 113b of the dies 110. In FIG. 4, a portion of the encapsulant is laterally disposed from, and attached to, the peripheral sides 118a and 118b of the dies 110. Accordingly, a portion of the encapsulant has filled at least a portion of the space 135 between the first and second dies 110a and 110b. In other embodiments, the encapsulant 130 is only placed between the dies and does not cover the backsides 113a and 113b of the dies 110. The encapsulant 130 can be applied via various methods including an over mold method, a liquid dispense method, a film-assisted molding process, and a glob-type dispensing process, all of which are well-known to those skilled in the art. The encapsulant 130 can include various types of materials, including a dielectric material or an epoxy.

Figure 5:
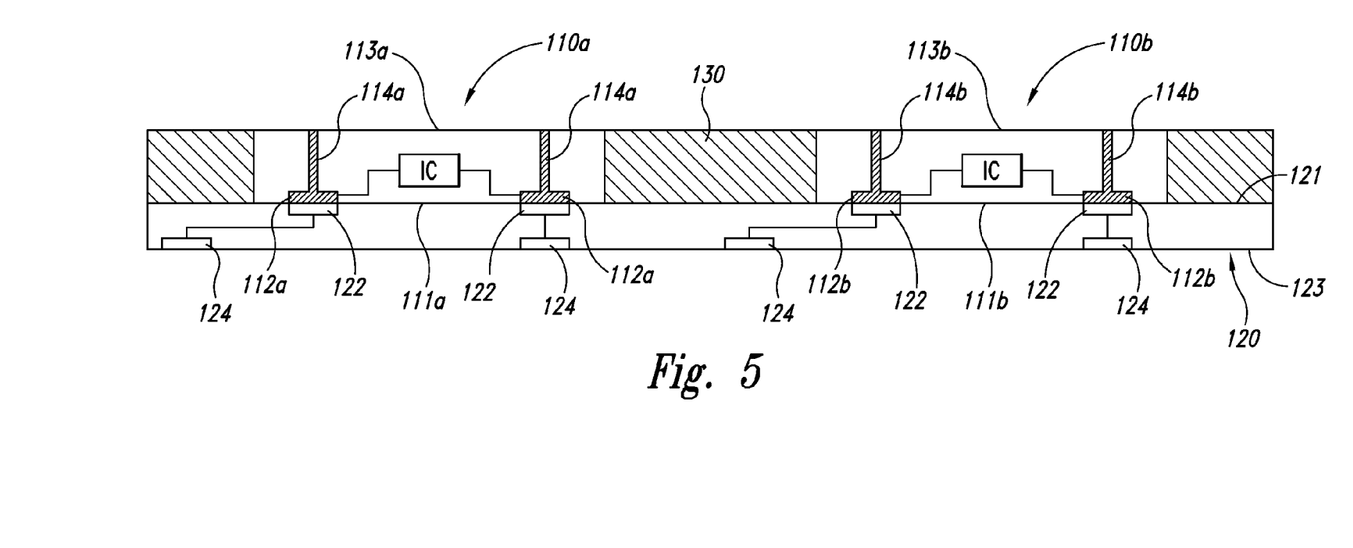

FIG. 5 is a partially schematic cross-sectional view of the dies 110 and support member 120 shown in FIG. 4 after removing at least a portion of the backsides of 113a and 113b of the dies 110 and a portion of the encapsulant 130 (e.g., by a planarization or back grinding process). In the illustrated embodiment, sufficient material has been removed from the backsides 113a and 113b to expose the second portions 116a and 116b of the through-wafer interconnects 114a and 114b. Also, in selected embodiments, the backsides 113a in 113b of the dies 110 and the encapsulant 134 can form a generally planar surface after removing the material, as shown in FIG. 5.

Figure 6:
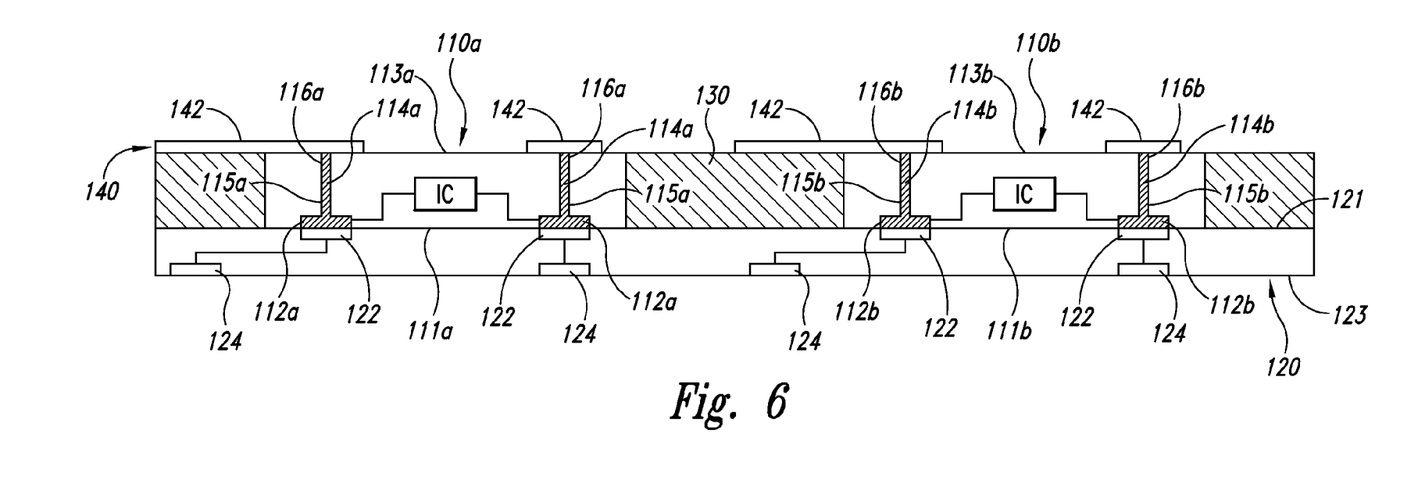

FIG. 6 is a partially schematic cross-sectional view of the dies 110 and support member 120 shown in FIG. 5 after a redistribution structure 140 has been applied to the backsides 113a and 113b of the dies 110. In the illustrated embodiment, the redistribution structure 140 has contacts electrically coupled to the second portions 116a and 116b of the through-wafer interconnects 114a and 114b. In FIG. 6, portions of the redistribution structure 140 extend over, or are carried by, at least part of the portion of the encapsulant 130 that is laterally adjacent to the dies 110. The redistribution structure 140, however, can be applied so that a portion of the redistribution structure 140 does not extend onto the encapsulant 130.

Figure 7:
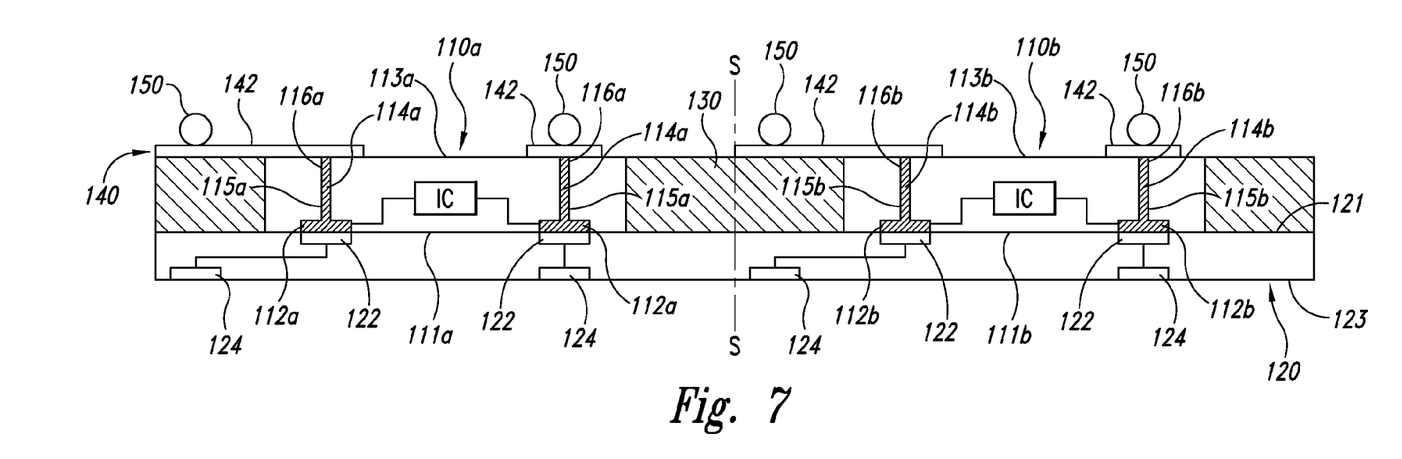

FIG. 7 is a partially schematic cross-sectional view of the dies 110 and support member 120, shown in FIG. 6, where connector elements 150 have been coupled to the redistribution structure 140. The connector elements 150 can include various types of connectors including solder balls, solder bumps, and/or reflowable contacts that can act as a connecting mechanism between multiple components during a reflow process (e.g., when multiple components that are being connected are placed in a reflow oven). The dies can then be separated to form multiple separate microelectronic devices. For example, in the illustrated embodiment the first and second dies 110 can be singulated by cutting along line S-S through the encapsulant 130 and the support member 122 to form two microelectronic devices 105, shown in FIG. 8 as a first microelectronic device 105a and a second microelectronic device 105b. In various embodiments, the microelectronic devices 105 can be operably coupled to one or more other electronic devices (e.g., a circuit board) via the second support contacts 124 and/or the connector elements 150.

A feature of some of the embodiments described above is that a build up package microelectronic device can be formed using fewer steps than is required with current processes. Accordingly, build up package microelectronic devices can be formed in less time allowing a higher throughput in the production process than with current methods. An advantage of this feature is that fewer steps in the formation process and/or higher production throughput can result in a cost savings per microelectronic device produced.

C. Additional Embodiments of Microelectronic Devices and Methods for Packaging Microelectronic Devices In other embodiments, the microelectronic devices 105 discussed above with reference to FIGS. 1-8 can have other arrangements, including more, fewer, and/or different components. For example, in certain embodiments the microelectronic devices 105 do not include connector elements 150 and/or a redistribution structure 140. In still other embodiments, at least a portion of the support member 120 is removed from at least one of the microelectronic devices 105. For example, in certain embodiments the support member 120, shown in FIG. 7, is removed from the dies 110 before the dies are separated. In still other embodiments, the microelectronic devices 105 are singulated before the one or more connector elements 150 are coupled to the microelectronic devices 105. In still other embodiments, the microelectronic devices 105 can be stacked with each other or with other types of microelectronic devices.

Figure 8:
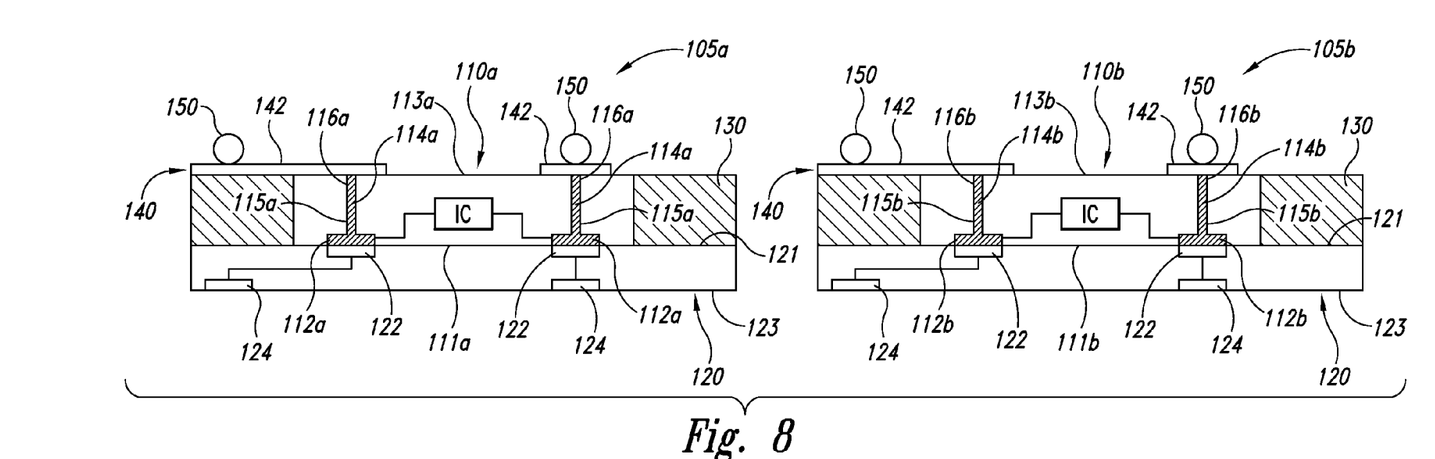
Figure 9:
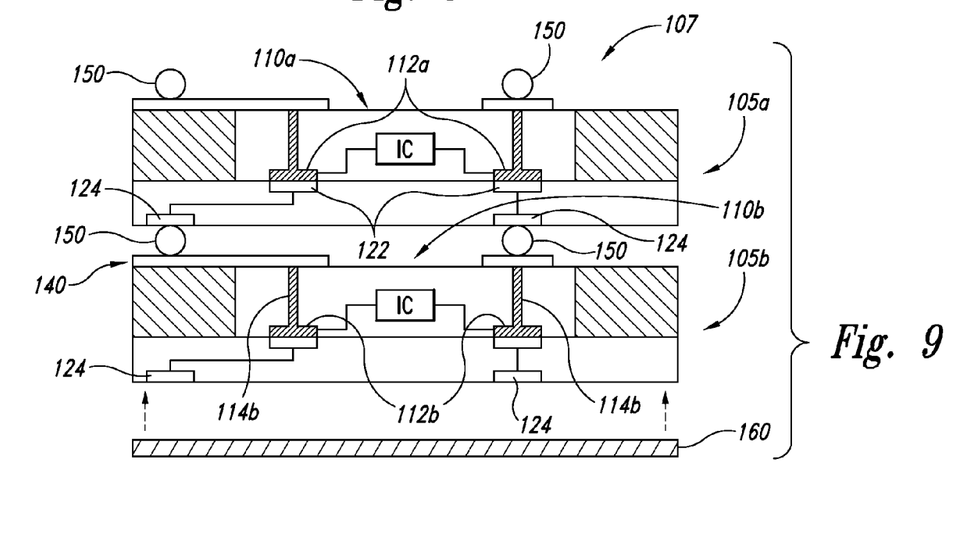
FIG. 9 is a schematic illustration of stacked microelectronic devices in accordance with selected embodiments of the invention.

For example, FIG. 9 is a partially schematic cross-sectional view of the first and second microelectronic devices 105a and 105b, shown in FIG. 8, stacked on one another to form a stacked unit 107. In FIG. 9, the first microelectronic device 105a has been positioned relative to the second microelectronic device 105b so that the connector elements 150 of the second microelectronic device 105b are in contact with the second support contacts 124 (discussed above with reference to FIG. 2) of the first microelectronic device 105a. Accordingly, in the illustrated embodiment the integrated circuits IC of the first microelectronic device 105a are connected to the integrated circuits IC of the second microelectronic device 105b. For example, in the illustrated embodiment, the integrated circuits IC of the second microelectronic device 105b are electrically connected to the connector elements 150 via the die contacts 112b, the through-wafer interconnects 114b, and the redistribution structure 140. The connector elements 150 are electrically connected to the integrated circuits IC of the first microelectronic device 105a via the second support contacts 124, the first support contacts 122, and the die contacts 112a.

In the illustrated embodiment, the connector elements 150 of the first microelectronic device can be used to operably couple the stacked unit 107 to another device (e.g., a circuit board). In still other embodiments, the second contact pads of the second microelectronic device 105b can be used to operably couple the stacked unit 107 to another device. Although only two microelectronic devices 105a and 105b are shown stacked in FIG. 9, in other embodiments three or more microelectronic devices can be stacked together. Additionally, in certain embodiments a coating or covering 160 can be applied to at least one surface of at least one microelectronic device to provide protection and/or insulation. For example, the covering 160 shown in FIG. 9 can include various types of material, including dielectric materials and/or encapsulants.

A feature of some of the embodiments discussed above with reference to FIGS. 1-9 is that build up package microelectronic devices can be formed so that they can be stacked with one another and/or with other microelectronic devices. Stacked microelectronic devices can take up less space on a circuit board and/or allow designers to use space more efficiently by distributing microelectronic devices in multiple dimensions when placing microelectronic devices in electronic products. An advantage of this feature is that electronic products using build up package microelectronic devices can be made smaller in response to consumer demand.

Figure 10:
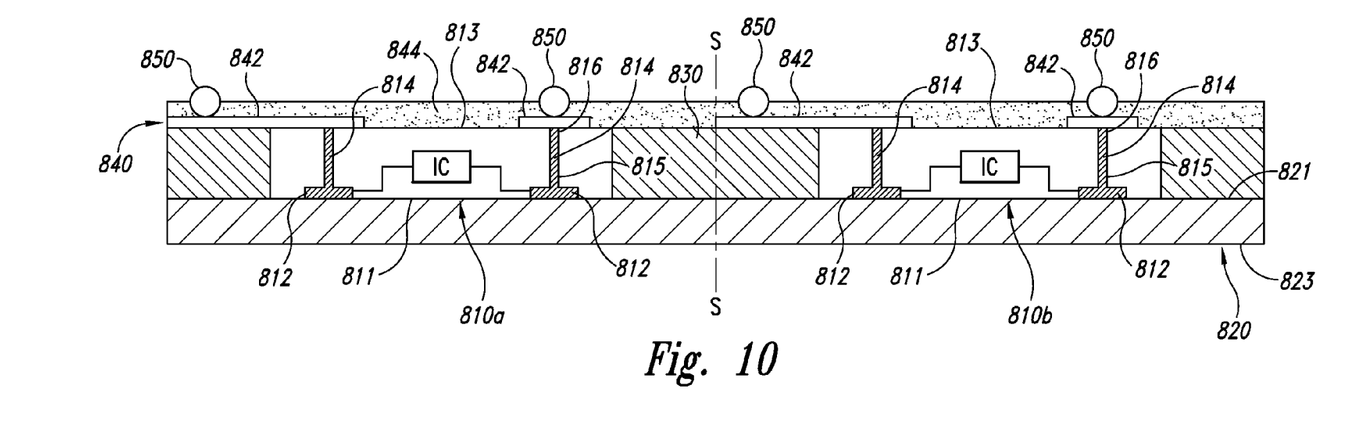
FIGS. 10-11 schematically illustrate the formation of microelectronic devices in accordance with other embodiments of the invention.

In other embodiments, the microelectronic devices can have still other arrangements. For example, FIG. 10 is a partially schematic cross-sectional view of a two microelectronic dies 810, shown as a first microelectronic die 810a and a second microelectronic die 810b, coupled to a temporary support member 820. In FIG. 10, individual dies include an active side 811, a backside 813, integrated circuitry IC, one or more die contacts 812, and one or more through-wafer interconnects 814. The dies 810 are attached to the support member 820, but the support member 820 does not include any electrical contacts.

In FIG. 10, an encapsulant 830 has been applied to the dies 810 and to portions of the support member 820 so that a portion of the encapsulant 830 is in the spaces between the dies 810. Some of the encapsulant 830 and a portion of the backsides 813 of the dies 810 have been removed to form a generally planar surface and expose portions of the through-wafer interconnects 814. A redistribution structure 840 has been applied to the backsides 813 of the dies 810 and is electrically coupled to the exposed portions of the through-wafer interconnects 814 (e.g., the redistribution structure 840 can be attached to or in contact with the through-wafer interconnects 814).

Additionally, in the illustrated embodiment connector elements 850 have been coupled to portions of the redistribution structure 840 and at least one dielectric material 844 has been applied or placed over at least a portion of the redistribution structure 840 so that the connector elements extend through or above the dielectric material 844. The dielectric material 844 can provide insulation and/or protection for the redistribution structure 840. In certain embodiments, the dielectric material 844 can be applied to the redistribution structure 840 before the connector elements 850 are coupled to the redistribution structure 840. In other embodiments, the dielectric material 844 can be applied to the redistribution structure 840 after the connector elements 850 have been coupled to the redistribution structure 840.

Figure 11:
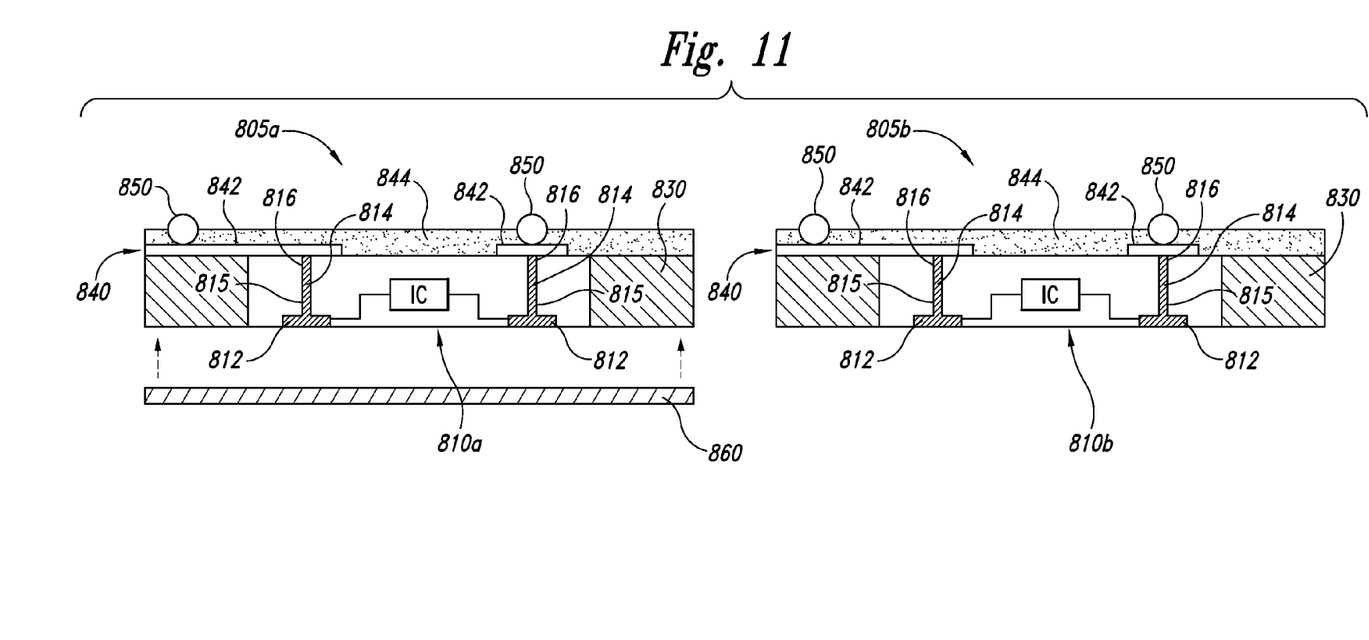

FIG. 11 is a partially schematic cross-sectional view of two microelectronic devices 805, shown as a first microelectronic device 805a and a second microelectronic device 805b, in accordance with embodiments of the invention. In the illustrated embodiment, the microelectronic devices 805 were formed by cutting the arrangement shown in FIG. 10 along line S-S to form the separate microelectronic device 805. As shown in FIG. 11, the support member 820 has been removed from the microelectronic devices 805 (e.g., before or after singulating the microelectronic devices 805). In other embodiments, the dielectric material 844, the one or more redistribution structure 840, and/or of the connector elements 850 can be positioned on the respective microelectronic devices 805 after the microelectronic devices 805 have been separated from one another. As discussed above with reference to FIG. 9, in certain embodiments a protective and/or insulative coating or covering 860 can be positioned on portions of one or more of the microelectronic devices 805.

Figure 12:
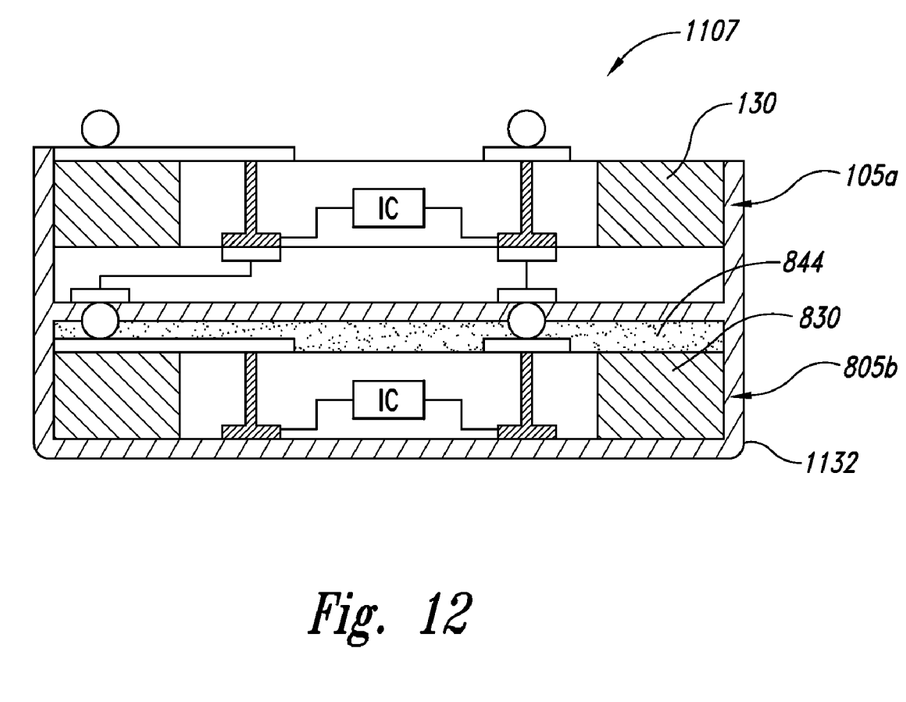
FIG. 12 is a schematic illustration of stacked microelectronic devices in accordance with still other embodiments of the invention.

As discussed above, in certain embodiments the microelectronic devices can be stacked or stackable. For example, in FIG. 12 the second microelectronic device 805b, shown in FIG. 11, is shown stacked with the first microelectronic device 105*a*, shown in FIG. 8, to form a stacked unit 1107. In FIG. 12, an encapsulating material 1132 has been applied to the stacked unit 1107 (e.g., on, around, and/or between the microelectronic devices 105*a* and 805*b*) to provide structural support, insulation, and/or protection for the stacked unit 1107. As discussed above, the encapsulating material 1132 can include various types of material, including dielectric materials and/or epoxies. Features and advantages of embodiments discussed above with reference to FIGS. 10-12 are similar to those discussed above with reference to FIGS. 1-9.

From the foregoing, it will be appreciated that specific embodiments of the invention have been described herein for purposes of illustration, but that various modifications may be made without deviating from the invention. For example, aspects of the invention described in the context of particular embodiments may be combined or eliminated in other embodiments. Furthermore, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. A microelectronic device, comprising:
   a microelectronic die having an active side, a backside opposite the active side, a peripheral side extending at least part way between the active side and the backside, and at least one through-wafer interconnect having a first portion at the active side of the microelectronic die and a second portion;
   a redistribution structure electrically coupled to the second portion of the through-wafer interconnect; and
   an encapsulant laterally adjacent to the peripheral side, wherein the encapsulant, the backside, and the second portion of the through-wafer interconnect are coplanar, and wherein the encapsulant, the active side, and the first portion of the through-wafer interconnect are coplanar.

2. The device of claim 1 wherein the encapsulant is attached to the peripheral side of the microelectronic die.

3. The device of claim 1 wherein the encapsulant includes an epoxy.

4. The device of claim 1, further comprising a support member with a surface, the active side of the microelectronic die being coupled to the surface of the support member so that the active side of the microelectronic die is facing to the surface of the support member.

5. The device of claim 1, further comprising a support member with a surface, the active side of the microelectronic die being electrically coupled to the surface of the support member so that the active side of the microelectronic die is adjacent to the surface of the support member.

6. The device of claim 1, further comprising a support member with no electrical contacts, the support member having a surface, the active side of the microelectronic die being coupled to the surface of the support member so that the active side of the microelectronic die is facing to the surface of the support member.

7. The device of claim 1, further comprising connector elements electrically coupled to the redistribution structure.

8. The device of claim 1 wherein the redistribution structure extends over at least a portion of the encapsulant laterally adjacent to the peripheral side of the microelectronic die.

9. A microelectronic device, comprising:
   a support member having a surface;
   a microelectronic die having an active side, a backside, and one or more through-wafer interconnects, the through-wafer interconnects having first portions electrically coupled to the active side of the microelectronic die and second portions exposed through and coplanar with the backsides of the microelectronic dies, the microelectronic die being coupled to the surface of the support member so that the active side of the microelectronic die is facing the surface of the support member;
   a redistribution structure electrically coupled to the second portions of the through-wafer interconnects; and
   an encapsulant covering at least a portion of the support member so that a portion of the encapsulant is laterally adjacent to the microelectronic die, wherein the encapsulant, the backsides of the microelectronic die, and the second portions of the through-wafer interconnects are coplanar, and wherein the encapsulant, the active side, and the first portions of the through-wafer interconnects are coplanar.

10. The device of claim 9 wherein the encapsulant is positioned to fill at least a portion of space between the microelectronic die coupled to the support member.

11. The device of claim 9 wherein the support member includes a support member without electrical contacts.

12. The device of claim 9, further comprising connector elements electrically coupled to the at least one redistribution structure.

13. The device of claim 9 wherein the redistribution structure extends over at least part of the portion of the encapsulant laterally adjacent to the microelectronic die.

14. The device of claim 9 wherein the microelectronic die has microelectronic circuitry, and wherein the through-wafer interconnects are formed concurrently with formation of the microelectronic circuitry.

15. A stacked microelectronic device, comprising:
   a first microelectronic device comprising:
      a microelectronic die having an active side, a backside, at least one peripheral side, and at least one through-wafer interconnect, the at least one through-wafer interconnect having a first portion electrically coupled to the active side of the microelectronic die and a second portion;
      a redistribution structure electrically coupled to the second portion of the at least one through-wafer interconnect; and
      an encapsulant adjacent to the at least one peripheral side, wherein the backside, the second portion of the through-wafer interconnect, and the encapsulant are coplanar, and wherein the encapsulant, the active side, and the first portion of the through-wafer interconnect are coplanar; and
   at least one second microelectronic device stacked with the first microelectronic device.

16. The device of claim 15 wherein the encapsulant is attached to the at least one peripheral side of the first microelectronic device.

17. The device of claim 15 wherein the redistribution structure extends over at least a portion of the encapsulant laterally adjacent to the at least peripheral side.

18. The device of claim 15, wherein the first microelectronic device further comprises a support member having a first surface with first support contacts and a second surface with second support contacts electrically coupled to the first support contacts, the active side of the microelectronic die being electrically coupled to the first surface via the first support contacts so that the active side of the microelectronic die is adjacent to the first surface of the support member, and wherein the at least one second microelectronic device is electrically coupled to the support member of the first microelectronic device via the second support contacts.

19. The device of claim 15, wherein the first microelectronic device further comprises connector elements electrically coupled to the redistribution structure, and wherein the redistribution structure of the first microelectronic device is coupled to the at least one second microelectronic device via the connector elements.

20. The device of claim 15, further comprising an encapsulating material covering at least a portion of the first microelectronic device and at least a portion of the at least one second microelectronic device.

21. The device of claim 14 wherein the encapsulant is formed over the microelectronic die and the through-wafer interconnect.

* * * * *

UNITED STATES PATENT AND TRADEMARK OFFICE
CERTIFICATE OF CORRECTION

PATENT NO. : 8,203,213 B2  
APPLICATION NO. : 12/826384  
DATED : June 19, 2012  
INVENTOR(S) : Choon Kuan Lee et al.

Page 1 of 1

It is certified that error appears in the above-identified patent and that said Letters Patent is hereby corrected as shown below:

In column 12, line 5, in Claim 21, delete "claim 14" and insert -- claim 15 --, therefor.

Signed and Sealed this
Fourth Day of September, 2012

David J. Kappos
*Director of the United States Patent and Trademark Office*